United States Patent
Plat

(10) Patent No.: US 6,222,241 B1
(45) Date of Patent: Apr. 24, 2001

(54) METHOD AND SYSTEM FOR REDUCING ARC LAYER REMOVAL BY PROVIDING A CAPPING LAYER FOR THE ARC LAYER

(75) Inventor: Marina V. Plat, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,236

(22) Filed: Oct. 29, 1999

(51) Int. Cl.[7] ............................................. H01L 31/0232
(52) U.S. Cl. .............................................. 257/437; 257/639
(58) Field of Search ................................ 257/437, 639; 438/636

(56) References Cited

U.S. PATENT DOCUMENTS 5,397,725 * 3/1995 Wolstenholme et al. ............ 438/261

FOREIGN PATENT DOCUMENTS 9-74145 * 3/1997 (JP) .

* cited by examiner

Primary Examiner—Sara Crane
Assistant Examiner—Thien F. Tran
(74) Attorney, Agent, or Firm—Sawyer Law Group LLP

(57) ABSTRACT

A method and system for providing a semiconductor device is disclosed. The method and system include depositing an antireflective coating (ARC) layer having antireflective properties. The method and system also include depositing a capping layer on the ARC layer. The capping layer reduces a susceptibility of the ARC layer to removal while allowing the ARC layer to substantially retain the antireflective properties.

5 Claims, 7 Drawing Sheets

METHOD AND SYSTEM FOR REDUCING ARC LAYER REMOVAL BY PROVIDING A CAPPING LAYER FOR THE ARC LAYER

FIELD OF THE INVENTION

The present invention relates to semiconductor devices, such as flash memory devices, more particularly to a method and system for reducing removal of the antireflective-coating by condensing the ARC layer.

BACKGROUND OF THE INVENTION

A conventional semiconductor device, such as a conventional embedded flash memory, includes a large number of memory cells in a memory region. The memory cells are typically floating gate devices, such as floating gate transistors. The conventional embedded memory may also include logic devices in a second region, or core, of the conventional embedded memory. The logic and memory regions of the conventional embedded memory are typically processed separately.

FIG. 1 is a flow chart depicting a conventional method 10 for processing a portion of a conventional semiconductor device, such as a conventional embedded flash memory. A polysilicon layer is deposited across a semiconductor substrate, via step 12. The polysilicon layer is typically deposited on a thin insulating layer grown on the substrate. A conventional SiON antireflective coating ("ARC") layer of a desired thickness is then deposited, via step 14. The conventional ARC layer must be deposited in a very narrow range of the desired thickness in step 14. This is because the antireflective properties of the conventional ARC layer are highly dependent upon the thickness of the conventional ARC layer. Typically, the desired thickness of the conventional ARC layer is three hundred Angstroms plus or minus ten percent (thirty Angstroms).

A first photoresist layer is then patterned on the conventional ARC layer, via step 16. The first photoresist layer pattern is typically obtained by spinning a layer of photoresist onto the ARC layer and exposing portions of the photoresist layer to light through a mask layer to develop a pattern, or mask, in the photoresist layer. The first photoresist layer patterned in step 16 typically completely covers the logic region of the conventional imbedded memory. The first photoresist layer also includes a pattern over the memory region to define stacked gates in the memory region of the conventional imbedded memory.

Once the first photoresist pattern has been defined, the stacked gates of the memory region are etched, via step 18. The first resist layer is then removed and residues cleaned using a wet etch, via step 20. A second photoresist pattern is then defined, via step 22. Step 22 typically includes spinning a second layer of photoresist onto the conventional embedded memory and developing the pattern of the second photoresist structure using conventional photolithography. Masking in the second photoresist layer defines gates in the logic region of the conventional imbedded memory, while the second photoresist layer also covers the memory region to ensure that processing of the logic region does not affect the memory region. The gates in the logic region are then etched, via step 24. The second photoresist layer may then be stripped and residues cleaned, via step 26. Processing of the conventional imbedded memory is then completed, via step 28.

Although the conventional method 10 can be used, one of ordinary skill in the art will readily understand that the conventional method 10 results variations in the critical dimension of structures fabricated in the logic region of the conventional embedded memory. When photoresist is spun onto the conventional embedded memory in steps 16 or 22, the photoresist will vary in thickness. This is particularly true when the topology of the layers under the photoresist is not flat.

Variations in the photoresist layer thickness cause variations in the critical dimension of structures desired to be formed, otherwise known as the swing curve effect. FIG. 2 is a graph 30 depicting the swing curve effect, variations in critical dimension versus photoresist thickness. The plot 31 indicates the desired size, or desired critical dimension, of a particular feature. The desired size is set by the design of the conventional embedded memory and thus is independent of resist thickness. The plot 32 depicts the variation in critical dimension versus photoresist thickness when a conventional ARC layer of the appropriate thickness is used. Because the conventional ARC layer of the appropriate thickness is used, reflections from the layer(s) underlying the photoresist layer are reduced. Thus, the structures formed using the photoresist layer have a critical dimension that is close to the desired critical dimension.

Curve 34 depicts the variation in the critical dimension for the structure of the desired size when no conventional ARC layer or a conventional ARC layer of an incorrect thickness is used. The antireflective properties of the ARC layer are highly dependent on thickness of the ARC layer. When a resist pattern is formed without the ARC layer, light used in conventional photolithography may reflect off of the layer(s) and structures under the photoresist layer. The reflected light causes variations in critical dimensions of structures etched in the polysilicon layer and causes a phenomenon called reflective notching, a narrowing of the polysilicon lines as a result of reflections from the underlayer. Thus, the critical dimensions of structures fabricated with no conventional ARC layer or a conventional ARC layer without the desired thickness vary more strongly with photoresist thickness. This variation is shown in curve 34.

FIG. 3A depicts a portion of a conventional embedded memory 40 after step 16, patterning the first resist layer, is performed. The conventional embedded memory 40 includes a logic region 44 and a memory region 42. A polysilicon layer 51 is provided on substrate 50. Note that an insulating layer (not shown) typically separates the polysilicon layer 51 from the substrate 50. In addition, underlying structures 47 and 49 are shown. Structures 47 and 49 were obtained prior to deposition of the polysilicon layer 51. A conventional ARC layer 52 having the desired thickness for reducing reflections is provided on the polysilicon layer 51. The thickness of the conventional ARC layer 52 is typically three hundred Angstroms plus or minus approximately ten percent. The first photoresist structure 53 covers the logic region 44, but defines the pattern for stacked gates in the memory region 42. Note that the first photoresist structure 53 varies in thickness.

FIG. 3B depicts a portion of a conventional embedded memory 40 after step 18, etching gates in the memory region 42, of the method 10 shown in FIG. 1 is performed. Referring to FIG. 3B, stacked gates 54, 56 and 58 have been formed in the memory region 42 of the conventional embedded memory 40. The stacked gates 54, 56 and 58 are covered by remaining portions 55, 57 and 59, respectively, of the ARC layer 52. Portions of the first photoresist layer 53 still covers the stacked gates 54, 56 and 58 as well as the polysilicon layer 51 and the conventional ARC layer 52 in the logic region 44. Because the conventional ARC layer 52 has the desired thickness, the critical dimensions of gates 54, 56 and 58 are quite close to what is desired. In other words, variations in the critical dimension of the gates 54, 56 and 58 may follow the curve 32 depicted in FIG. 2.

FIG. 3C depicts a portion of a conventional embedded memory 40 after step 20, stripping the first photoresist structure 53, of the method 10 shown in FIG. 1 is performed. Referring to FIG. 3C, a portion of the conventional ARC layer 52 has been removed during the strip of the photoresist structure 53. Thus, the conventional ARC layer 52 is thinner than in FIG. 3B. Typically, twenty to fifty Angstroms are removed during the wet resist strip after the etch performed in step 20. After the etch, the thickness of the conventional ARC layer 52 is twenty to fifty Angstroms thinner than the optimal thickness. Consequently, removal of a portion of the conventional ARC layer 52 during the resist strip is likely to significantly reduce the ability of the conventional ARC layer 52 to decrease reflections. Thus, the gates formed in step 24 in the logic region 44 will have critical dimensions which vary greatly. In other words, the critical dimensions of structures, such as gates, in the logic region will follow the curve 44 shown in FIG. 2. These large variations are undesirable. In order to reduce these variations in the logic region 44, the ARC layer 52 and photoresist structure 53 would be removed. The ARC layer 52 would then be replaced with another ARC layer (not shown) that is deposited at the desired thickness.

Accordingly, what is needed is a system and method for providing the conventional semiconductor device, such as an imbedded memory, in which the ARC layer need not be removed and redeposited. The present invention addresses such a need.

SUMMARY OF THE INVENTION

The present invention provides a method and system for providing a semiconductor device. The method and system comprise depositing an antireflective coating (ARC) layer having antireflective properties. The method and system also comprise depositing a capping layer on the ARC layer. The capping layer reduces a susceptibility of the ARC layer to removal while allowing the ARC layer to substantially retain the antireflective properties.

According to the system and method disclosed herein, the present invention reduces the removal of the ARC layer during a photoresist strip by providing the capping layer on the ARC layer. Consequently, the ARC properties of the ARC layer are preserved, allowing a reduction in the swing curve effect and reflective notching.

DETAILED DESCRIPTION OF THE INVENTION

Figure 1:
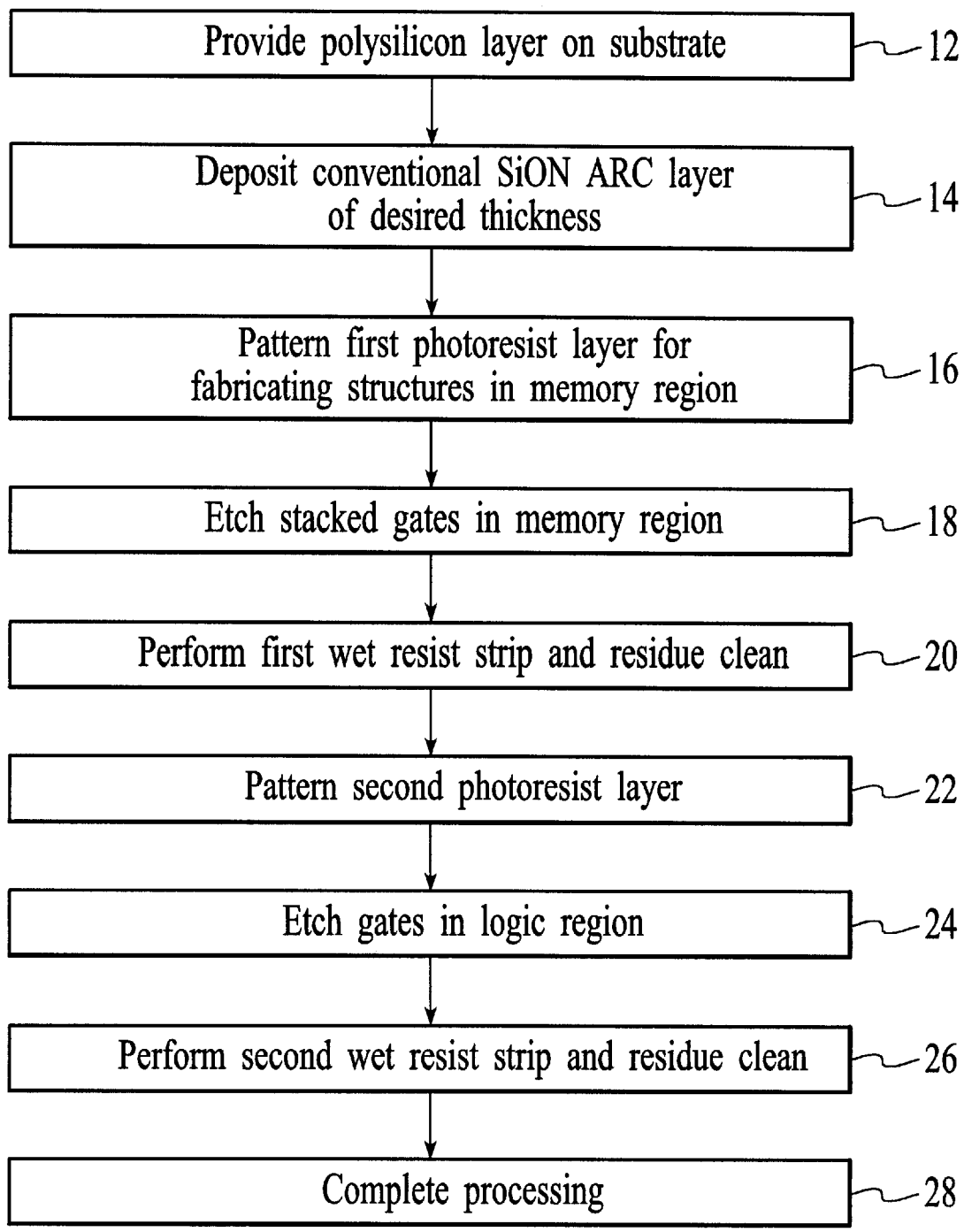
FIG. 1 is a flow chart of a conventional method for providing a portion of semiconductor device
Figure 2:
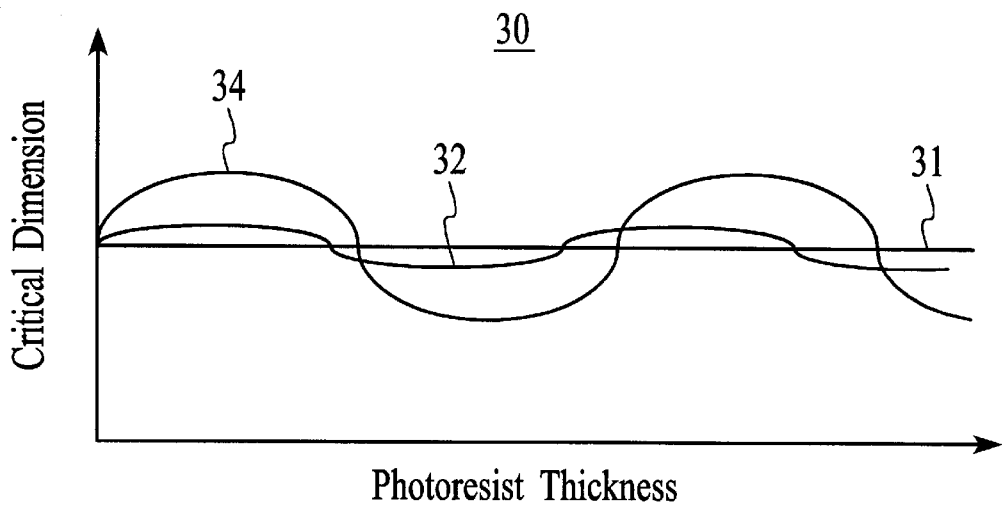
FIG. 2 is a graph depicting the variation in critical dimension versus photoresist thickness.
Figure 3A:
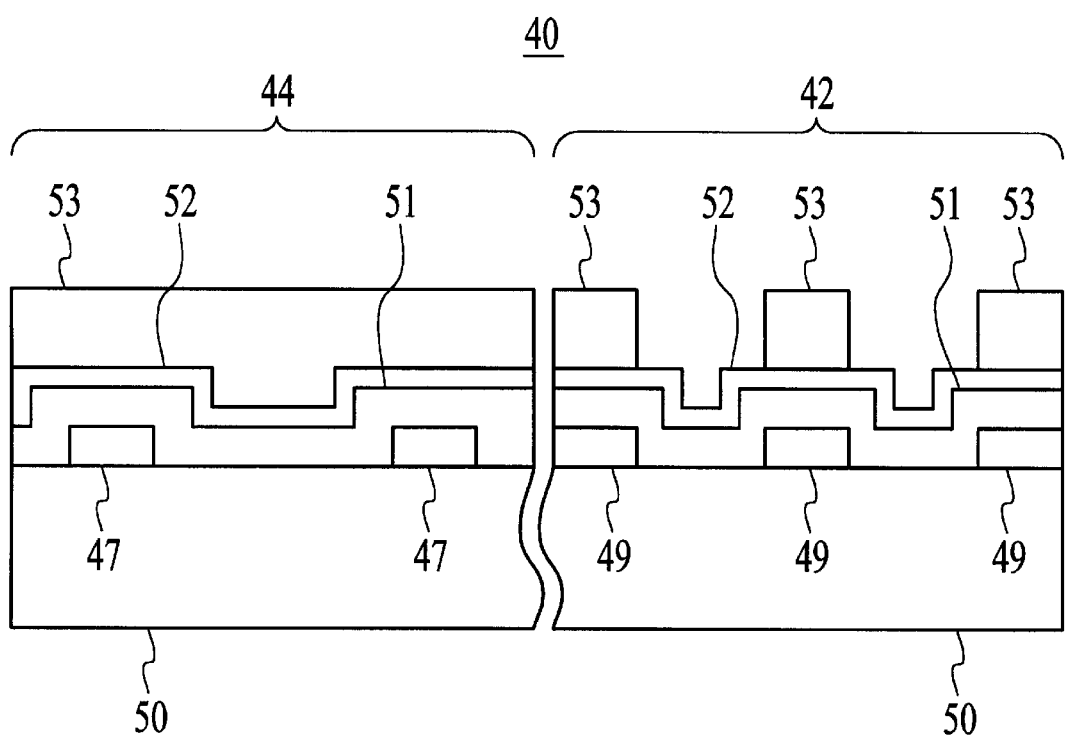
FIG. 3A is diagram of a portion of a conventional embedded memory after the first photoresist layer has been patterned.
Figure 3B:
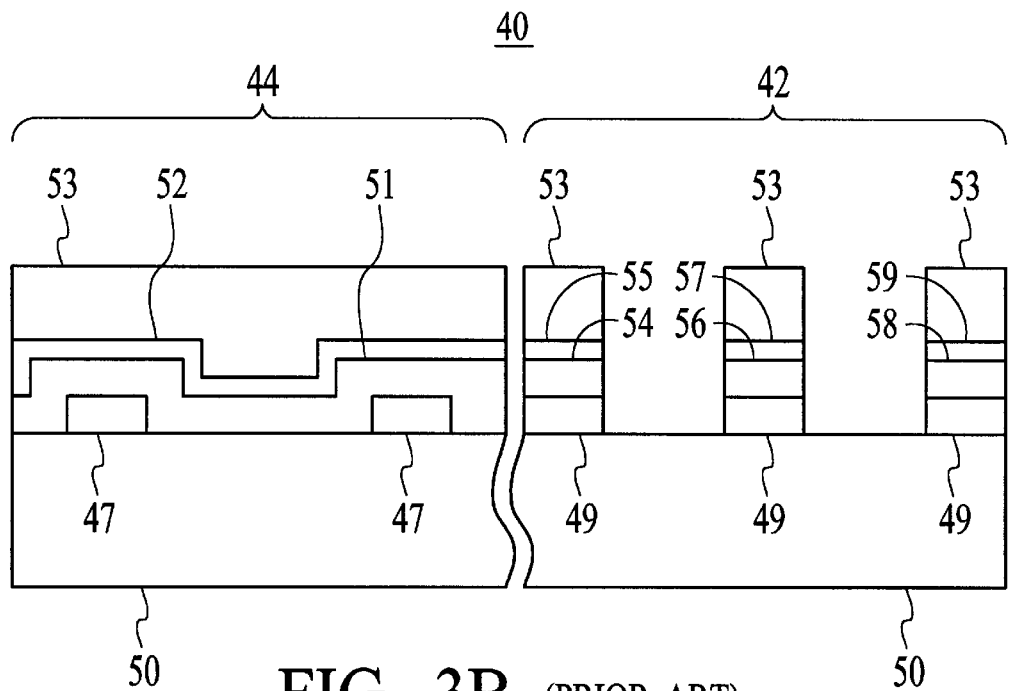
FIG. 3B is a diagram of a portion of the conventional embedded memory after the stacked gates have been etched.
Figure 3C:
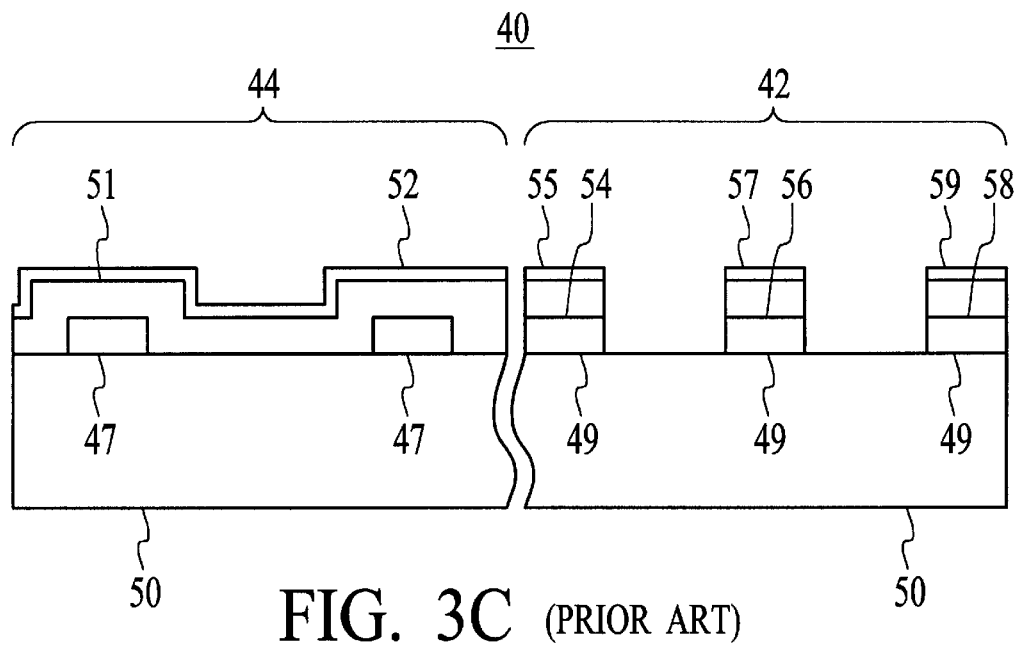
FIG. 3C is a diagram of a portion of the conventional embedded memory after the first photoresist layer has been removed and residues cleaned.

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional semiconductor devices are typically processed using conventional antireflective coating (ARC) layers. For example, a conventional semiconductor device, such as an embedded flash memory, contains a logic region and a memory region. In order to pattern gates with a narrow distribution of the critical dimension in the logic region and the memory region, a conventional ARC layer is deposited on a polysilicon layer. The conventional ARC layer is typically SiON. The antireflective properties of the conventional ARC layer are highly dependent on the thickness of the conventional ARC layer. Typically, the conventional ARC layer has a desired thickness of three hundred Angstroms plus or minus approximately thirty Angstroms thick. Outside of this desired thickness, the conventional ARC layer may not adequately reduce or prevent reflections.

Typically, the conventional ARC layer is deposited with the desired thickness. The gates in the memory portion of the conventional imbedded memory are then patterned. Typically, this includes patterning a first layer of photoresist and etching the polysilicon and conventional ARC layer. The first layer of photoresist completely covers the logic region of the conventional memory and is patterned in the memory region. After the stacked gates are etched, the first photoresist layer is stripped using a wet chemical. The gates in the logic portion of the conventional imbedded memory are then patterned. This step is typically performed by patterning a second photoresist layer and etching the polysilicon and conventional ARC layer under apertures in the second photoresist layer. For this step, the second photoresist layer typically covers the memory region and is patterned in the logic region of the conventional imbedded memory. Thus, the gates in the memory region and the gates in the logic region are processed independently.

The stripping of the photoresist structure after gates in the memory region are formed using the first etch removes a significant portion of the conventional ARC layer, typically twenty to fifty Angstroms. The desired thickness of the conventional ARC layer is approximately three hundred Angstroms plus or minus about ten percent. Thus, removal of a portion of the conventional ARC layer during the photoresist strip may take the conventional ARC layer far enough away from the desired thickness that the conventional ARC layer is no longer efficient. Thus, when the structures, such as gates, in the logic region are formed, the critical dimension of the structures varies greatly due to the swing curve effect and reflective notching.

One method for remedying this would be to deposit a thicker conventional ARC layer at the outset. Once the first photoresist structure is stripped, the conventional ARC layer would have the desired thickness. Variations of the critical dimensions of structures in the logic region due to the swing curve effect would be reduced. However, because the conventional ARC layer was thicker as provided, the conventional ARC layer might not function properly for processing of the memory region. Thus, variations in the critical dimensions of structures in the memory region due to the swing curve effect or reflective notching would be greatly increased.

The present invention provides a method and system for providing a semiconductor device. The method and system comprise depositing an antireflective coating (ARC) layer having antireflective properties. The method and system also comprise depositing a capping layer on the ARC layer. The capping layer reduces a susceptibility of the ARC layer to removal while allowing the ARC layer to substantially retain the antireflective properties.

The present invention will be described in terms of a particular device having certain components and particular techniques for performing certain steps, such as the use of a particular capping layer having a certain thickness. However, one of ordinary skill in the art will readily recognize that this method and system will operate effectively for other devices having other components and other techniques. Furthermore, the present invention will be described in terms of a particular semiconductor memory device, an embedded memory. However, nothing prevents the method and system from being utilized with another semiconductor device.

Figure 4A:
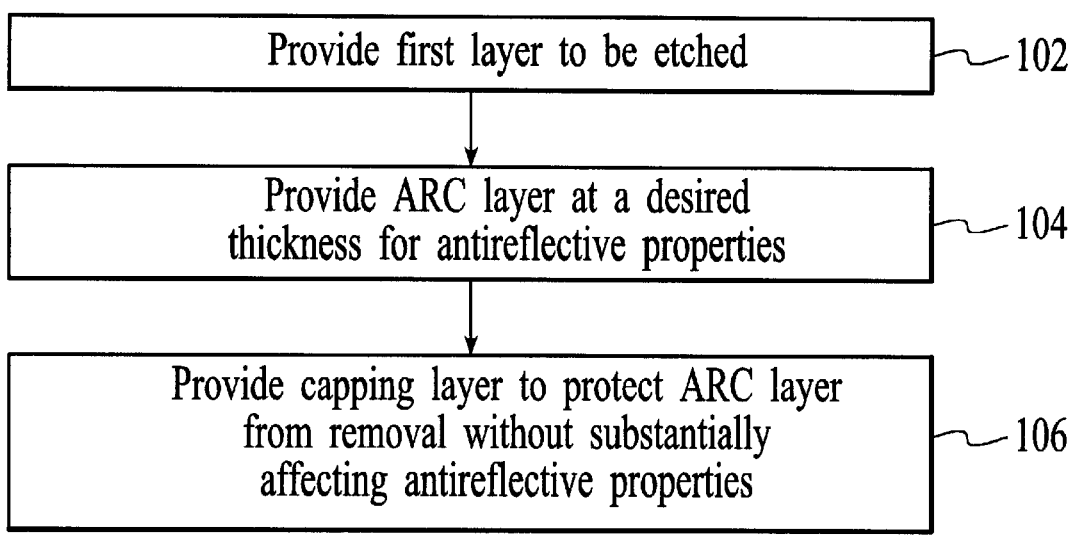
FIG. 4A is a flow chart depicting one embodiment of a method for providing a portion of a semiconductor device and an ARC layer in accordance with the present invention.

To more particularly illustrate the method and system in accordance with the present invention, refer now to FIG. 4A, depicting one embodiment of a method 100 in accordance with the present invention for providing a semiconductor device such as an embedded memory. A first layer to be etched is provided, via step 102. The first layer to be etched may be a polysilicon layer that is generally deposited. The polysilicon layer is to be patterned into stacked gates and logic gates. An ARC layer of a desired thickness is provided, preferably by depositing the ARC layer, via step 104. Preferably, the ARC layer provided in step 104 is a SiON layer. Also in a preferred embodiment, the desired thickness of the ARC layer is approximately three hundred Angstroms, plus or minus about ten percent. However, the ARC layer may have another desired thickness. For example, in some other applications, the desired thickness of the ARC layer may be one hundred to five hundred Angstroms. A capping layer is then provided on the ARC layer, preferably by depositing the capping layer, via step 106. The capping layer reduces or prevents the removal of the ARC layer during a wet photoresist strip without substantially affecting the antireflective properties of the ARC. layer. In other words, the capping layer allows the ARC layer to substantially retain its antireflective properties. The capping layer should also be resistant to the photoresist strip, particularly a wet photoresist strip. Preferably, the capping layer provided has these properties because of the material(s) composing the capping layer and the thickness of the capping layer. In a preferred embodiment, the capping layer is a polysilicon layer of approximately twenty to fifty Angstroms. Such a capping layer can reduce the removal of the ARC layer in a wet photoresist strip while allowing the ARC layer to retain its antireflective properties. The ARC layer provided in step 104 can be preserved for use in processing multiple sections of the semiconductor device because the capping layer reduces or prevents removal of the ARC layer during the photoresist strip. At the same time, the ARC layer's optical properties remain essentially unchanged. As a result, the critical dimensions of the structures formed using the ARC layer will not vary greatly due to the swing curve effect.

Figure 4B:
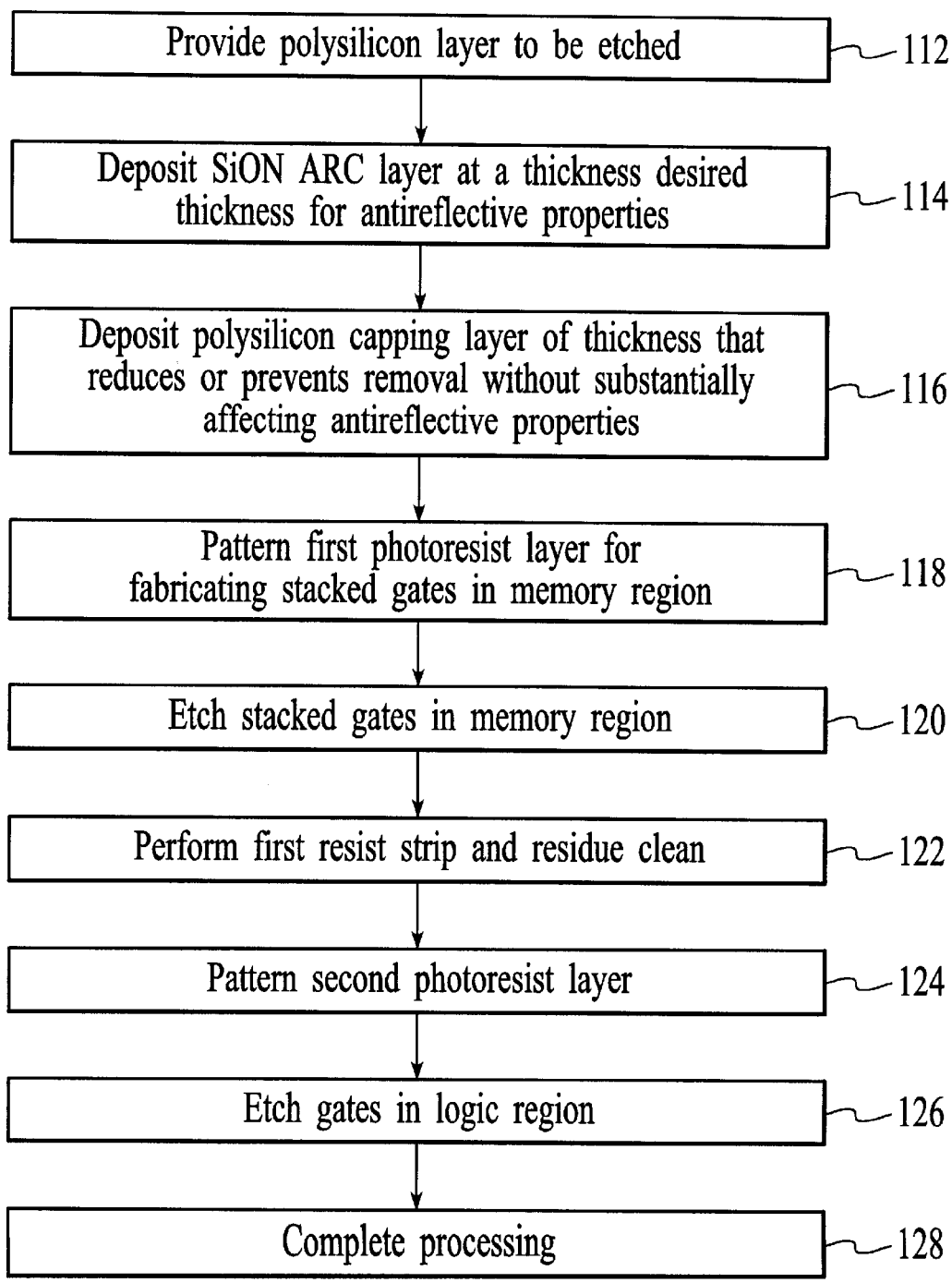
FIG. 4B is a more detailed flow chart depicting one embodiment of a method for providing a portion of a semiconductor device in accordance with the present invention.

FIG. 4B depicts a more detailed flow chart of a method for providing a portion of a semiconductor device, such as an embedded memory, which has a logic region and a memory region. A polysilicon layer is deposited on a semiconductor substrate, via step 112. The polysilicon layer is analogous to the first layer provided in step 102 depicted in FIG. 4A. The polysilicon layer is to be patterned into the stacked and logic gates. Referring back to FIG. 4B, a SiON ARC layer is deposited at the desired thickness for the SiON ARC layer, via step 114. The desired thickness is approximately three hundred Angstroms plus or minus approximately thirty Angstroms. A polysilicon capping layer that is thick enough to prevent or reduce removal of the ARC layer in a wet photoresist strip yet thin enough to leave the antireflective properties of the ARC layer substantially unchanged is then deposited, via step 116. Preferably, this thickness of polysilicon is approximately twenty to fifty Angstroms. A first resist layer is then patterned, via step 118. Preferably, step 118 includes spin-coating photoresist on the embedded memory and developing a pattern in the photoresist using photolithography. The first resist layer is patterned over a first region and covers a second region. Thus, the first resist layer is for fabricating structures in the first region of the embedded memory. In a preferred embodiment, the first resist layer is for providing stacked gates in the memory region of the semiconductor device. Thus, in a preferred embodiment, the first region of the embedded memory is the memory region. The structures in the first region are etched, via step 120. The first resist structure stripped and the etch residues cleaned, via step 122. Step 122 preferably includes utilizing a wet photoresist strip.

A second resist layer for a second portion of the embedded memory is then provided, via step 124. Preferably, step 124 includes spin-coating photoresist on the embedded memory and developing a pattern in the photoresist using photolithography. The second resist layer is patterned over the second region and covers the first region. Thus, the second resist layer is for fabricating structures in the second region of the embedded memory. In a preferred embodiment, the second resist layer is for providing gates in the logic region of the embedded memory. Thus, in a preferred embodiment, the second region of the embedded memory is the logic region. The structures in the second region of the embedded memory are then etched, via step 126. Processing of the embedded memory may be completed, via step 128. Step 128 thus includes stripping the second photoresist layer and performing any subsequent processing steps.

Because the ARC layer is capped in steps 106 and 116, the ARC layer in accordance with the present invention is less susceptible to removal to a photoresist strip. In one embodiment, a wet photoresist strip does not remove any of the SiON ARC layer. In another embodiment, a wet photoresist strip removes only a small portion of the SiON ARC layer. This portion is small enough to allow the SiON ARC layer to continue to act as an antireflective layer. Instead, some or all of the polysilicon capping layer may be removed. Using a capping layer that is resistant to a wet photoresist strip reduces the portion of the capping layer removed. The preservation of most or all of the ARC layer is in contrast to removal of ten to twenty Angstroms of a conventional ARC layer. Because the ARC layer in accordance with the present invention is less subject to removal, the thickness of the ARC layer is preserved for fabrication of structures in the first and second portions of a semiconductor device. The ARC layer can thus still reduce the variation of the critical dimensions of structure fabricated. Furthermore, the capping layer leaves the antireflective properties of the ARC layer essentially unchanged. Thus, the ARC layer can function as an antireflective layer even though the ARC layer is covered by the capping layer. Thus, the variation in the critical dimensions of structures fabricated using the ARC layer and capping layer combination is reduced. For example, the stacked gates of the memory region and the gates of the logic region can both be formed without being subject to wide variations in critical dimension due to the swing curve effect. Consequently, processing of a semiconductor device such as an embedded memory is facilitated.

Figure 5A:
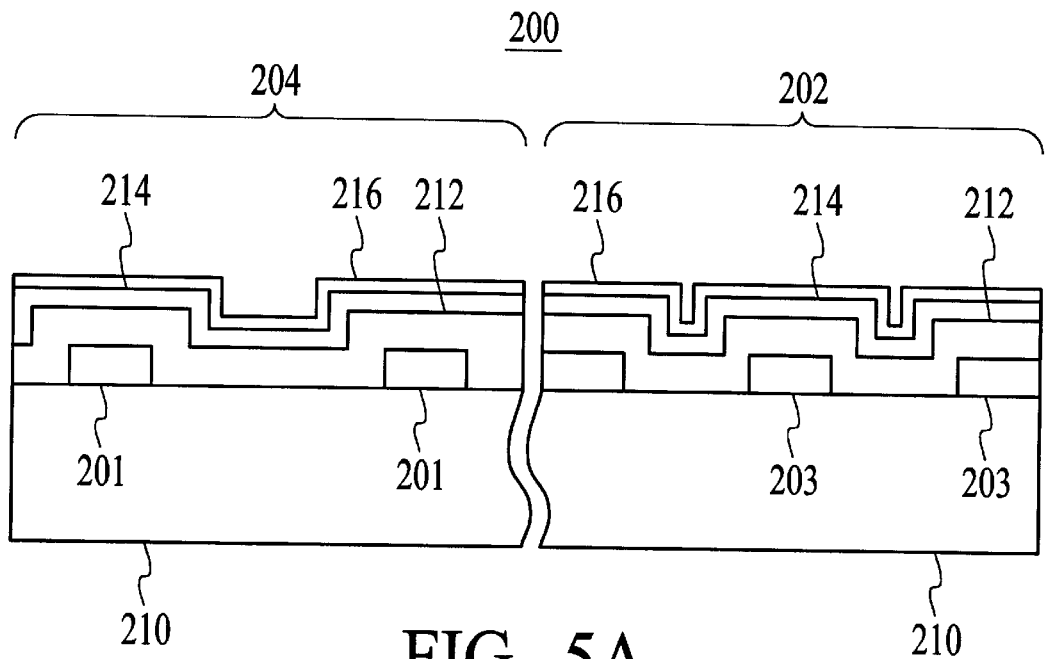
FIG. 5A is a diagram depicting a semiconductor device after the ARC layer and capping in accordance with the present invention have been provided.
Figure 5B:
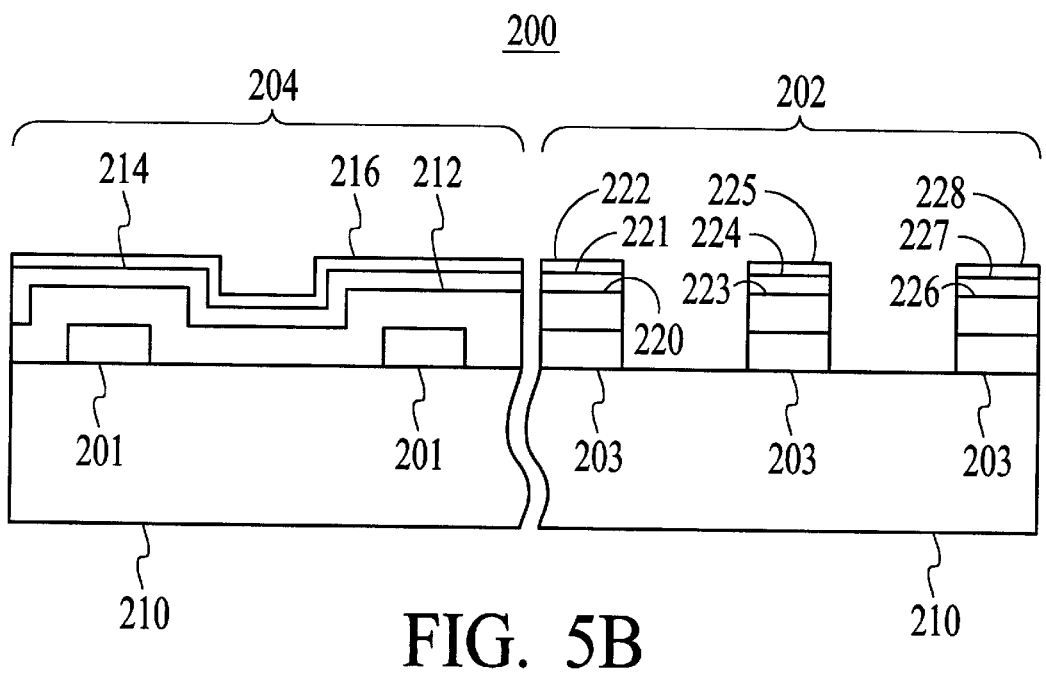
FIG. 5B is a diagram depicting a semiconductor device in accordance with the present invention after the first photoresist structure has been stripped.
Figure 5C:
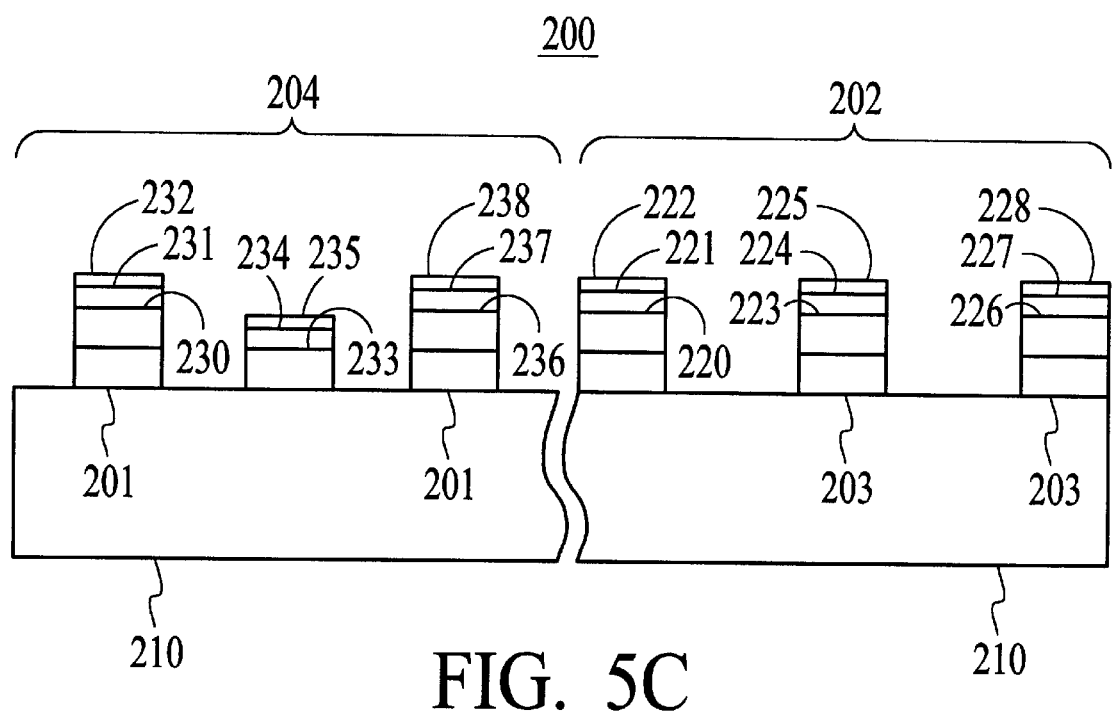
FIG. 5C is a diagram depicting a semiconductor device in accordance with the present invention after the second photoresist structure has been stripped.

For example, refer to FIGS. 5A–5C, depicting an embedded memory 200 during processing in accordance with the methods 100 or 110. FIG. 5A depicts the embedded memory 200 after step 106 or 116 of depositing the capping layer has been performed. The embedded memory 200 includes a memory region 202 and a logic region 204. A polysilicon layer 212 has been deposited on a substrate 210. The polysilicon layer 212 is generally separated from the substrate 210 by a thin insulating layer (not shown). In addition, underlying structure 201 and 203 in the logic and memory regions, respectively, are shown. The ARC layer 214 has been provided on the polysilicon layer 212 at the desired thickness. The capping layer 216 has also been provided.

FIG. 5B depicts the embedded memory 200 after the first resist layer has been stripped, for example in step 122 of FIG. 4B. Referring back to FIG. 5B, the stacked gates 220, 223 and 226 have been defined in the memory region 202. Because of the etching, only portions 221, 224 and 227 of the ARC layer 214 remain in the memory region 202. Only the portions 222, 225, and 228 of the capping layer 216 remain for the same reason. Because the capping layer 216 does not alter the ARC layer's antireflective properties, the stacked gates 220, 223 and 226 have critical dimensions close to what is desired. Thus, the ARC layer 214 has greatly reduced the swing curve effect in the memory region. No structures have been formed in the logic region 202. Furthermore, the wet resist strip has not affected the thickness of the ARC layer 214 because the capping layer 216 has been provided. Consequently, the ARC layer 214 still retains sufficient antireflective properties to be used in fabricating structures in the logic region 204.

FIG. 5C depicts the embedded memory 200 after removal of the second resist layer. Thus, the gates 230, 233 and 236 have been formed in the logic region 204. The gates 230, 233 and 236 have been formed in the logic region 204. Because of the presence of the ARC layer 214, remaining as regions 231, 234 and 237, the critical dimensions of structures in the logic region 204 do not vary greatly. Thus, the swing curve effect has been greatly reduced in the logic region 204 of the semiconductor device 200. Thus, processing of the embedded memory 200 is facilitated.

A method and system has been disclosed for providing an ARC layer covered by a capping layer which makes the ARC layer is less subject to removal during stripping of a photoresist structure while allowing the ARC layer to retain its antireflective properties. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
   a plurality of memory cells including an antireflective coating (ARC) layer and at least a portion of a capping layer covering the ARC layer, the ARC layer having antireflective properties, the capping layer reducing a susceptibility of the ARC layer to removal while allowing the ARC layer to substantially retain the antireflective properties, wherein the capping layer further includes a polysilicon capping layer and wherein the capping layer thickness of the polysilicon capping layer is twenty to fifty Angstroms.

2. The semiconductor device of claim 1 wherein the capping layer further has a capping layer thickness that is sufficient to reduce the susceptibility of the ARC layer to removal without substantially affecting the antireflective properties of the ARC layer.

3. The semiconductor device of claim 1 wherein the ARC layer is a SiON ARC layer and wherein a thickness of the SiON ARC layer is three hundred Angstroms plus or minus no more than approximately ten percent.

4. The semiconductor device of claim 2 wherein the susceptibility of removal of the ARC layer is a susceptibility to removal in a wet photoresist strip.

5. The semiconductor device of claim 1 further comprising:
   a plurality of logic cells including the ARC layer and at least a second portion of the capping layer covering the ARC layer, the ARC layer having antireflective properties, the capping layer reducing a susceptibility of the ARC layer to removal while allowing the ARC layer to substantially retain the antireflective properties.

* * * * *